US008362594B2

(12) United States Patent
Chua et al.

(10) Patent No.: US 8,362,594 B2
(45) Date of Patent: *Jan. 29, 2013

(54) SEMICONDUCTOR ASSEMBLIES AND METHODS OF MANUFACTURING SUCH ASSEMBLIES INCLUDING TRENCH AND CHANNEL INTERSECTS WITH THROUGH-HOLE IN THE MOLD MATERIAL

(75) Inventors: Swee Kwang Chua, Singapore (SG); Suan Jeung Boon, Singapore (SG); Yong Poo Chia, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/074,938

(22) Filed: Mar. 29, 2011

(65) Prior Publication Data

US 2011/0175206 A1 Jul. 21, 2011

Related U.S. Application Data

(60) Continuation of application No. 12/696,182, filed on Jan. 29, 2010, now Pat. No. 7,915,711, which is a division of application No. 11/933,754, filed on Nov. 1, 2007, now Pat. No. 7,674,655.

(30) Foreign Application Priority Data

Aug. 28, 2007 (SG) .................................. 200706296

(51) Int. Cl.
*H01L 21/44* (2006.01)
*H01L 21/31* (2006.01)
*H01L 21/469* (2006.01)
(52) U.S. Cl. ........................................ 257/621; 257/793
(58) Field of Classification Search ........... 257/E23.142, 257/621, 793
See application file for complete search history.

(56) References Cited

U.S. PATENT DOCUMENTS

| 4,567,812 A | 2/1986 | Weiler et al. |
| 4,930,216 A | 6/1990 | Nelson |
| 5,266,833 A | 11/1993 | Capps |
| 5,343,075 A | 8/1994 | Nishino |
| 5,834,162 A | 11/1998 | Malba |

(Continued)

FOREIGN PATENT DOCUMENTS

| DE | 102004041889 A1 | 3/2006 |
| DE | 102005003125 A1 | 7/2006 |

(Continued)

OTHER PUBLICATIONS

Furgut, E. et al., "Taking Wafer Level Packaging to the Next Stage: A 200mm Silicon Technology Compatible Embedded Device Technology," Advanced Packaging Conference, SEMICON Europa 2006, Munich, Germany, Apr. 4, 2006.

(Continued)

*Primary Examiner* — William M. Brewster
(74) *Attorney, Agent, or Firm* — Perkins Coie LLP

(57) ABSTRACT

Semiconductor devices and assemblies including interconnects and methods for forming such interconnects are disclosed herein. One embodiment of a method of manufacturing a semiconductor device includes forming a plurality of first side trenches to an intermediate depth in a molded portion of a molded wafer having a plurality of dies arranged in rows and columns. The method also includes removing material from a second side of the molded portion at areas aligned with the first side trenches, wherein removing the material forms openings through the molded portion. The method further includes forming a plurality of electrical contacts at the second side of the molded portion at the openings and electrically connecting the second side contacts to corresponding bond-sites on the dies.

19 Claims, 12 Drawing Sheets

U.S. PATENT DOCUMENTS

| | | | |
|---|---|---|---|
| 5,888,884 A | 3/1999 | Wojnarowski | |
| 6,351,028 B1 | 2/2002 | Akram | |
| 6,372,623 B1 | 4/2002 | Hoffman et al. | |
| 6,391,685 B1 | 5/2002 | Hikita et al. | |
| 6,412,971 B1 | 7/2002 | Wojnarowski et al. | |
| 6,521,995 B1 | 2/2003 | Akram et al. | |
| 6,528,393 B2 | 3/2003 | Tao | |
| 6,727,116 B2 | 4/2004 | Poo et al. | |
| 6,730,579 B1 | 5/2004 | Sasaka | |
| 6,753,599 B2 | 6/2004 | Kim | |
| 6,759,745 B2 | 7/2004 | Masumoto et al. | |
| 6,818,977 B2 | 11/2004 | Poo et al. | |
| 6,855,572 B2 | 2/2005 | Jeung et al. | |
| 6,949,407 B2 | 9/2005 | Jeung et al. | |
| 6,984,885 B1 * | 1/2006 | Harada et al. | 257/696 |
| 7,022,552 B2 | 4/2006 | Yamaguchi | |
| 7,115,483 B2 | 10/2006 | Kwon et al. | |
| 7,115,984 B2 | 10/2006 | Poo et al. | |
| 7,193,312 B2 | 3/2007 | Boon et al. | |
| 7,199,449 B2 | 4/2007 | Lake | |
| 7,208,335 B2 | 4/2007 | Boon et al. | |
| 7,298,037 B2 | 11/2007 | Yim et al. | |
| 7,375,009 B2 | 5/2008 | Chua et al. | |
| 7,511,379 B1 | 3/2009 | Flint, Jr. | |
| 7,585,750 B2 | 9/2009 | Do et al. | |
| 7,618,903 B2 | 11/2009 | Chae | |
| 7,659,145 B2 | 2/2010 | Do et al. | |
| 7,667,333 B2 | 2/2010 | Singleton et al. | |
| 7,674,655 B2 | 3/2010 | Chua et al. | |
| 7,713,785 B1 | 5/2010 | Flint, Jr. | |
| 7,863,722 B2 | 1/2011 | Chua | |
| 7,915,711 B2 * | 3/2011 | Chua et al. | 257/621 |
| 8,174,107 B2 | 5/2012 | Shinma | |
| 2002/0139577 A1 | 10/2002 | Miller | |
| 2003/0232488 A1 | 12/2003 | Chua et al. | |
| 2004/0070087 A1 | 4/2004 | Wang et al. | |
| 2004/0183185 A1 | 9/2004 | Badihi | |
| 2004/0221451 A1 | 11/2004 | Chia et al. | |
| 2004/0227258 A1 * | 11/2004 | Nakatani | 257/787 |
| 2005/0181540 A1 | 8/2005 | Farnworth et al. | |
| 2005/0269692 A1 | 12/2005 | Kwon et al. | |
| 2006/0197206 A1 | 9/2006 | Kim et al. | |
| 2006/0228825 A1 | 10/2006 | Hembree | |
| 2006/0228832 A1 | 10/2006 | Koh | |
| 2006/0258053 A1 * | 11/2006 | Lee et al. | 438/118 |
| 2007/0029666 A1 | 2/2007 | Goh et al. | |
| 2007/0126091 A1 | 6/2007 | Wood et al. | |
| 2007/0176275 A1 | 8/2007 | Singleton et al. | |
| 2007/0235851 A1 | 10/2007 | Ware et al. | |
| 2008/0036065 A1 | 2/2008 | Brunnbauer et al. | |
| 2008/0054432 A1 | 3/2008 | Corisis et al. | |
| 2008/0169546 A1 | 7/2008 | Kwon et al. | |
| 2008/0211113 A1 | 9/2008 | Chua et al. | |
| 2009/0057843 A1 | 3/2009 | Kwang et al. | |
| 2009/0230569 A1 | 9/2009 | Donis et al. | |

FOREIGN PATENT DOCUMENTS

| | | |
|---|---|---|
| JP | 11274354 A | 10/1999 |
| JP | 2004534375 A | 11/2004 |
| JP | 2004342861 A | 12/2004 |
| JP | 2005175019 A | 6/2005 |
| JP | 2005310954 A | 11/2005 |
| KR | 20030032313 A | 4/2003 |

OTHER PUBLICATIONS

International Search Report and Written Opinion issued Apr. 28, 2009 in International Application No. PCT/US2008/073878.

Search Report and Examination Report issued Jul. 16, 2009 in Singapore Application No. 200706296-1.

Office Action issued Aug. 30, 2011 in Japan Application No. 2010-523046, 8 pages.

Office Action issued in Taiwan Application No. 097132934, 23 pages, Feb. 6, 2012.

* cited by examiner

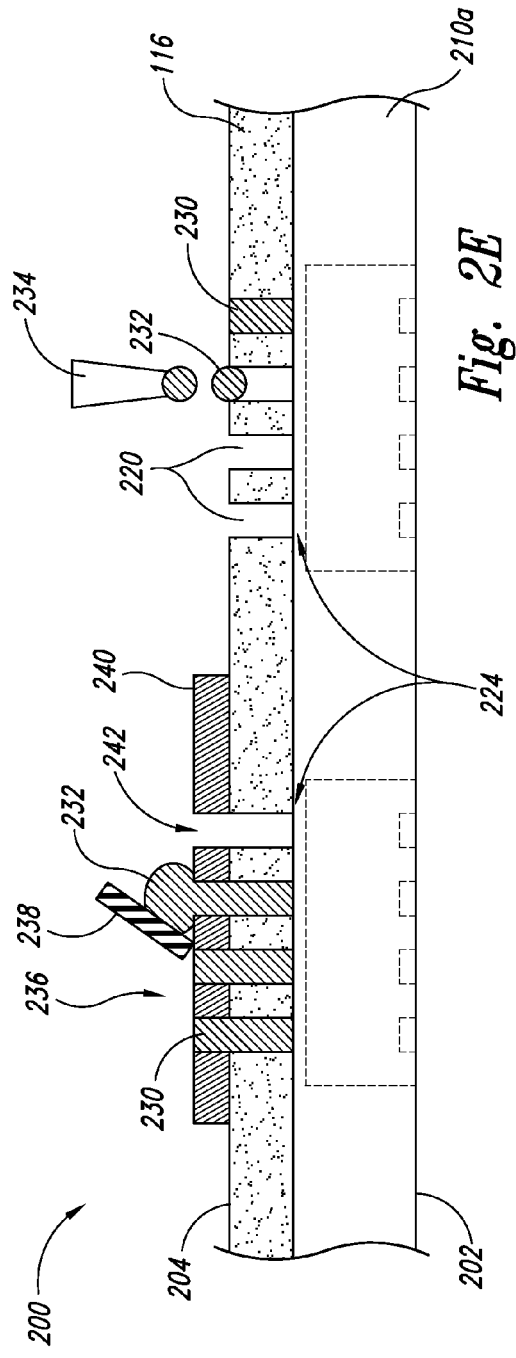
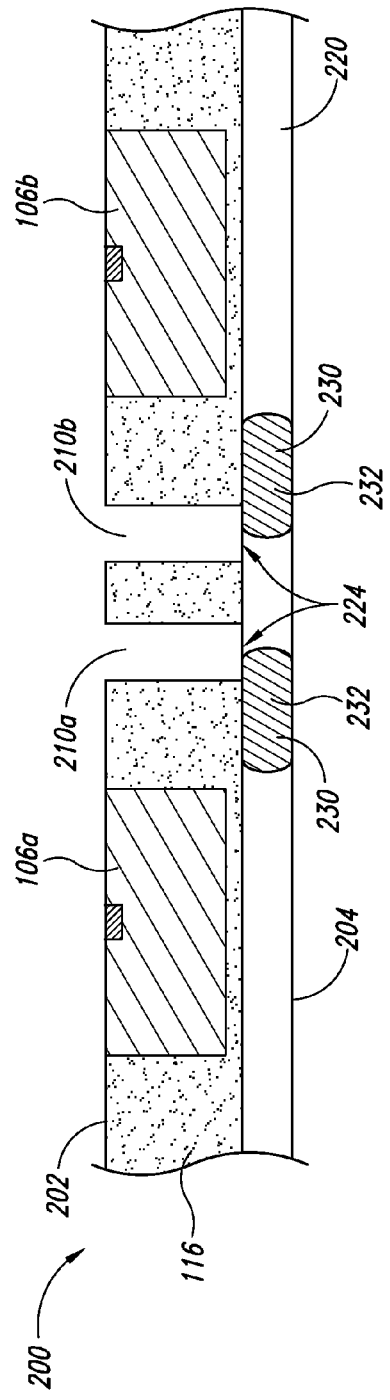

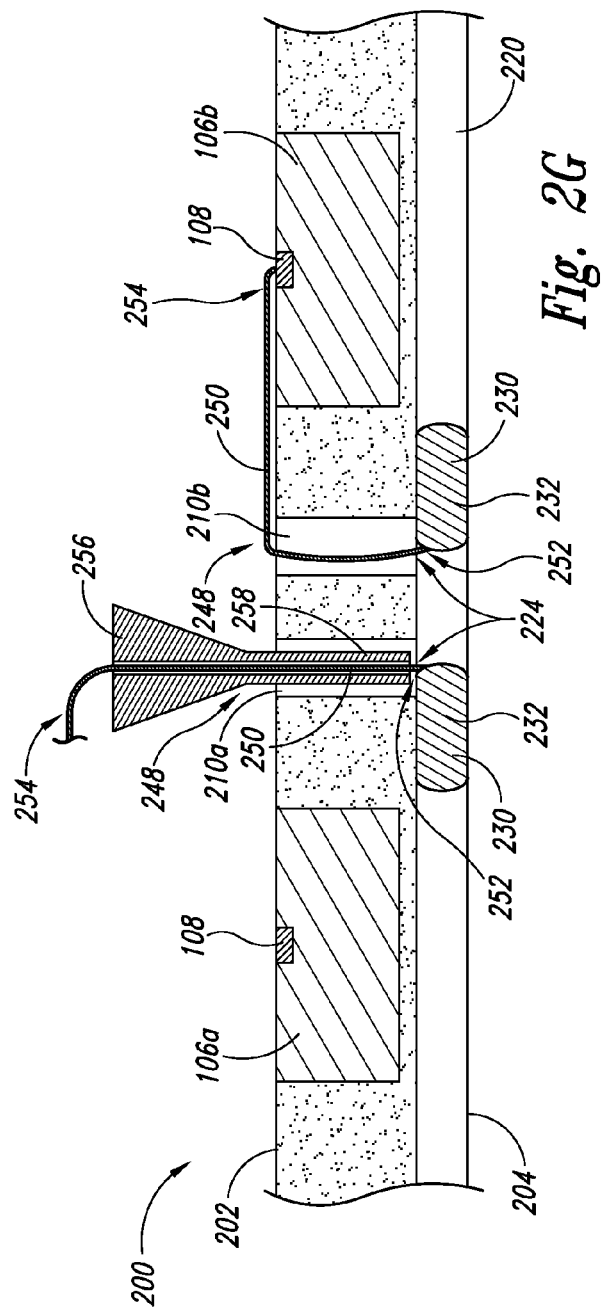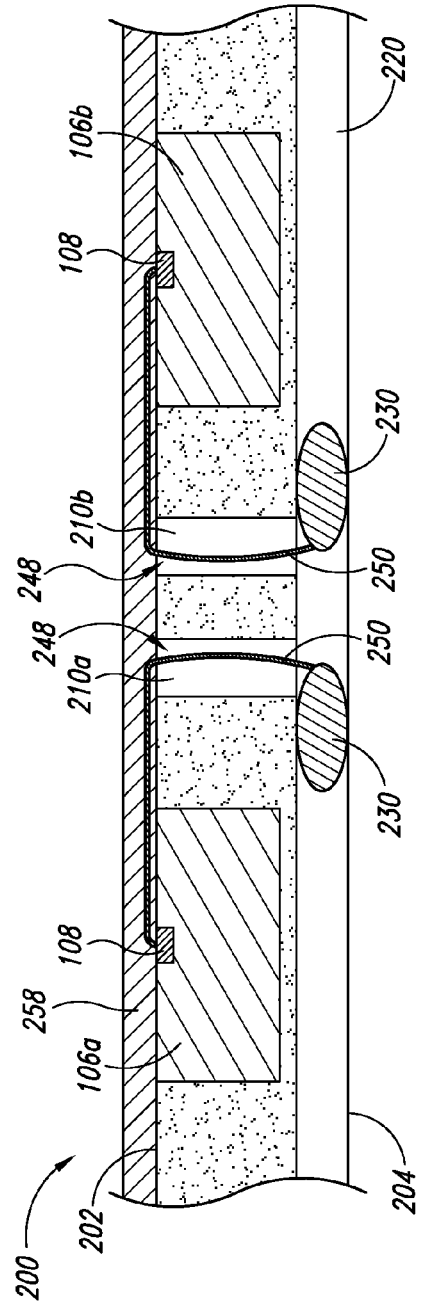

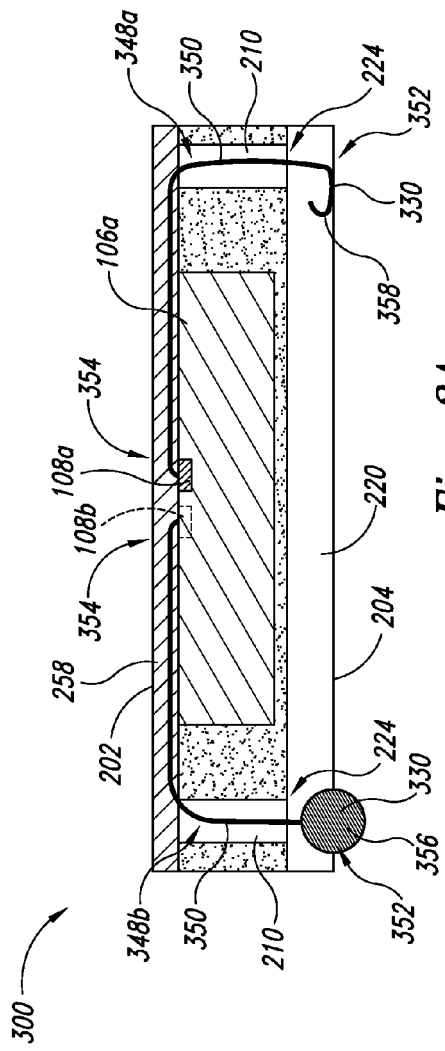
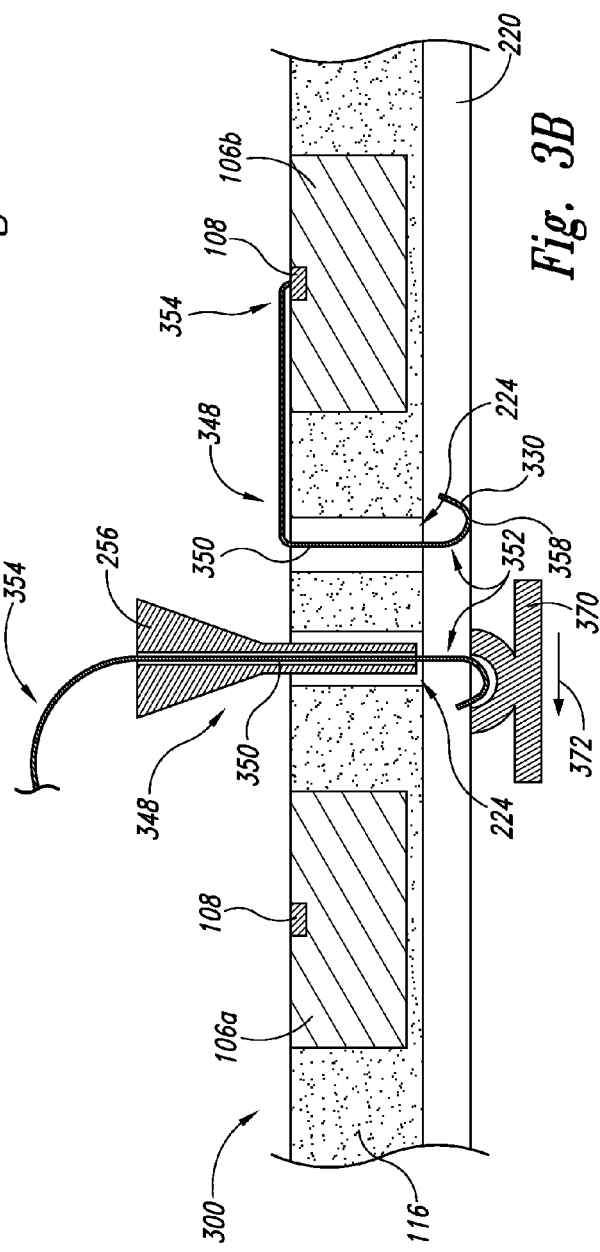

SEMICONDUCTOR ASSEMBLIES AND METHODS OF MANUFACTURING SUCH ASSEMBLIES INCLUDING TRENCH AND CHANNEL INTERSECTS WITH THROUGH-HOLE IN THE MOLD MATERIAL

CROSS-REFERENCE TO RELATED APPLICATIONS

This application is a continuation of U.S. patent application Ser. No. 12/696,182 filed Jan. 29, 2010, now U.S. Pat. No. 7,915,711, which is a divisional of U.S. application Ser. No. 11/933,754 filed Nov. 1, 2007, now U.S. Pat. No. 7,674,655, which claims foreign priority benefits of Republic of Singapore Application No 200706296-1 filed Aug. 28, 2007, now Singapore Patent No. 150404, each of which is incorporated herein by reference in its entirety.

TECHNICAL FIELD

The present invention relates to semiconductor devices and assemblies, and methods for manufacturing such devices and assemblies.

BACKGROUND

Semiconductor processing and packaging techniques are continually evolving to meet industry demands for improved performance with reduced size and cost. Electronic products require packaged semiconductor assemblies with a high density of devices in a relatively small space. For example, the space available for memory devices, processors, displays and other microfeature devices is continually decreasing in personal electronic devices such as cell phones, laptop computers and many other products. Accordingly, a need exists to decrease the overall size of the microfeature devices while still maintaining or improving performance and reducing cost.

One technique used to improve the performance and reduce the size and cost of these microfeature devices involves wafer level packaging ("WLP"). WLP generally refers to the packaging of microfeature devices at the wafer level, rather than processing and packaging individual devices after dicing them from a wafer. One benefit of WLP is that it creates chip-sized packages having the smallest form factor. WLP achieves these small sizes by limiting components of the package, such as interconnect elements, to be within the footprint or fan-in area of the device. These components are limited within the device footprint because the components are formed at the wafer level before the devices are singulated. WLP also provides the benefit of producing packages having excellent electrical and thermal performance due to the overall reduced size of the package and relatively short length of the interconnects. Additional advantages provided by WLP include the ease of fabrication and reduced assembly cost due to simultaneous or parallel processing and testing at the wafer level. Even though WLP may provide the benefits listed above, it may not be suitable for devices having high pin counts or high input/output requirements. For example, the space limitation of the device footprint restricts the number and pitch of the interconnect elements in the package.

To overcome this problem, the dies can be diced and plated in built-up packages that include interconnects which surround the die and extend through a molded polymer. Although positioning these interconnects outside of the footprint of the die can increase the number and/or pitch of the interconnects, it can significantly increase the cost and complexity of the processing. For example, in certain circumstances the filling process can trap air in the via that can cause the interconnect or package to crack as the fill material and the package harden. Such non-uniformities in the vias provide inconsistent electrical connections and compromise the integrity of the interconnects and performance of the package. Additionally, forming the vias by ablation or drilling processes typically requires forming individual vias in a sequential manner, thus increasing the processing time. Simultaneously forming the vias by an etching process can be much faster, but etching can result in inconsistent via sizes. It can also be difficult to achieve a dense distribution of the vias with an etching process. Moreover, the plating and filling processing steps following the via formation require additional processing time.

BRIEF DESCRIPTION OF THE DRAWINGS

FIGS. 2E-2I are side cross-sectional views illustrating various stages in a method of manufacturing a semiconductor assembly configured in accordance with an embodiment of the invention.

FIG. 3A is a side cross-sectional view of a semiconductor assembly configured in accordance with an embodiment of the invention.

FIGS. 3B and 3C are side cross-sectional views illustrating various stages in a method of manufacturing a semiconductor assembly configured in accordance with an embodiment of the invention.

DETAILED DESCRIPTION

Figure 1A:
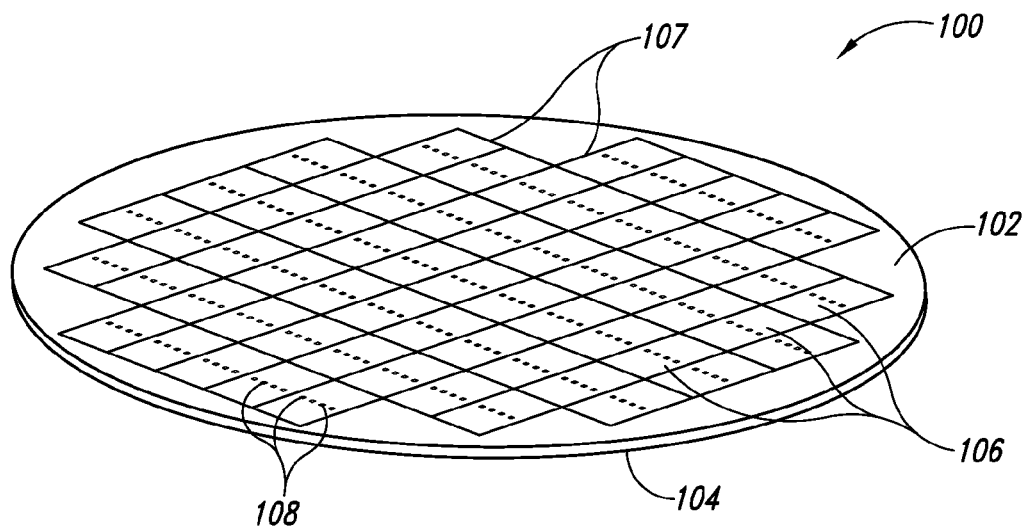
FIG. 1A is an isometric view of a conventional semiconductor wafer.

Several embodiments of the present disclosure are directed toward packaged semiconductor devices, assemblies and methods of forming such devices and assemblies. Many details of the disclosure are described below with reference to specific structures and methods of forming the devices and assemblies. The terms "semiconductor device" and "semiconductor assembly" are used throughout to include a variety of articles of manufacture including, for example, semiconductor wafers having active components, individual integrated circuit dies, packaged dies, and semiconductor devices or assemblies in a stacked configuration. Many specific details of certain embodiments are set forth in FIGS. 1A-6 and the following text to provide a thorough understanding of these embodiments. Like reference characters refer to like components in FIGS. 1A-6 and thus the description of many of these components will not be repeated with reference to the Figures. Several other embodiments can have different configurations, components or processes than those described in this section. A person skilled in the art, therefore, will appreciate that additional embodiments may exist or that the described embodiments may be practiced without several of the details described below.

FIG. 1A is an isometric view of a conventional semiconductor wafer 100 having a first side 102, a second side 104 and a plurality of semiconductor devices or dies 106. The dies 106 can include, for example, a dynamic or static random access memory, a flash memory, a microprocessor, an imager or another type of application specific integrated circuit. Individual dies 106 can include a plurality of bond-sites 108 at the first side 102 to electrically connect the dies 106 with other components. As explained below, the bond-sites 108 can include a staggered configuration at the first side 102 of the dies 106. The dies 106 are delineated by boundary lines 107, and the dies 106 are processed and built up on the wafer 100 before dicing along the boundary lines 107 to singulate the dies 106.

Figure 1B:
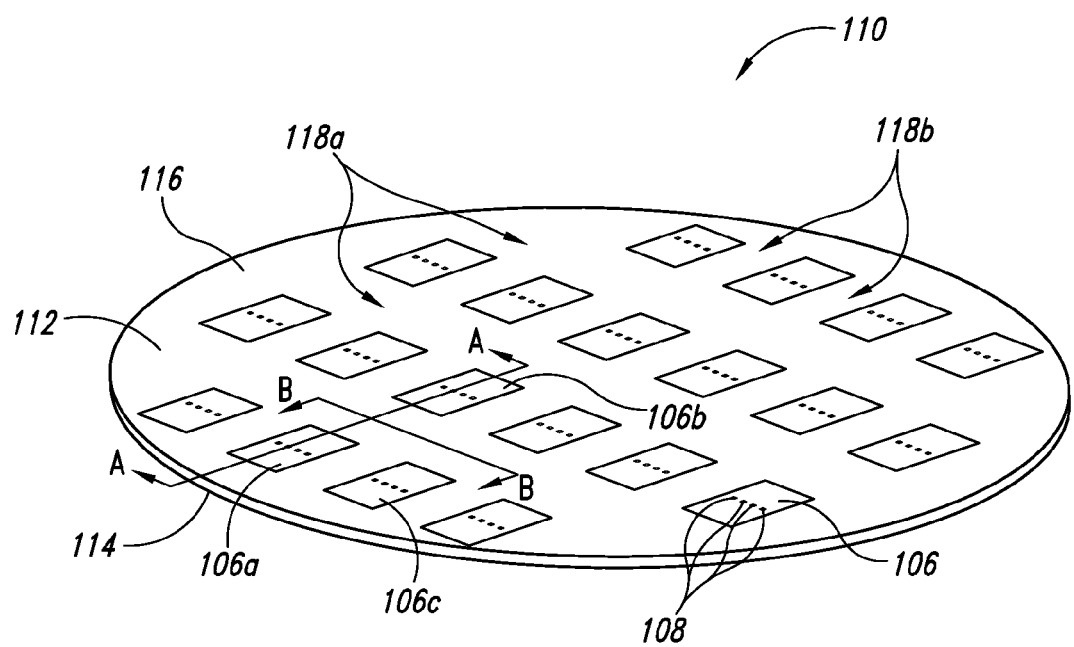
FIG. 1B is an isometric view of a molded wafer configured in accordance with an embodiment of the invention.

After singulating the dies 106 from the wafer 100, the dies 106 can be embedded in a mold material configured in a wafer form as illustrated in FIG. 1B. More specifically, FIG. 1B is an isometric view of a molded wafer 110 including a first side 112 and a second side 114. The molded wafer 110 is composed of a mold material 116 that can include, for example, thermosets, thermoplastics, hybridized versions of thermosets and thermoplastics, or other suitable mold materials. The molded wafer 110 also includes the singulated dies 106 (individually identified as a first die 106a, a second die 106b, etc.). In the illustrated embodiment, the bond-sites 108 are at the first side 112 of the molded wafer 110 and the dies 106 are positioned in a grid-like pattern and spaced apart from each other by lanes in the mold material 116. As illustrated in FIG. 1B, for example, the lanes between the dies can include rows 118a that run in a first direction between the dies 106, and columns 118b that run in a second direction between the dies 106 generally transverse to the rows 118a. One skilled in the art will appreciate that describing the lanes or spacing between the dies as "rows" and "columns" is for the purposes of illustration and does not necessarily require a horizontal or vertical configuration of the rows and columns. The rows 118a and columns 118b in the mold material 116 provide additional space around the dies 106 to form interconnect structures or other components. These interconnect structures are not typically formed between the dies 106 at the wafer 100 level (shown in FIG. 1A) due to cost restrictions of the wafer 100 material. Accordingly, the assemblies and methods described below utilize the molded wafer 110 configuration illustrated in FIG. 1B to form interconnect structures associated with the dies 106.

Figure 2A:
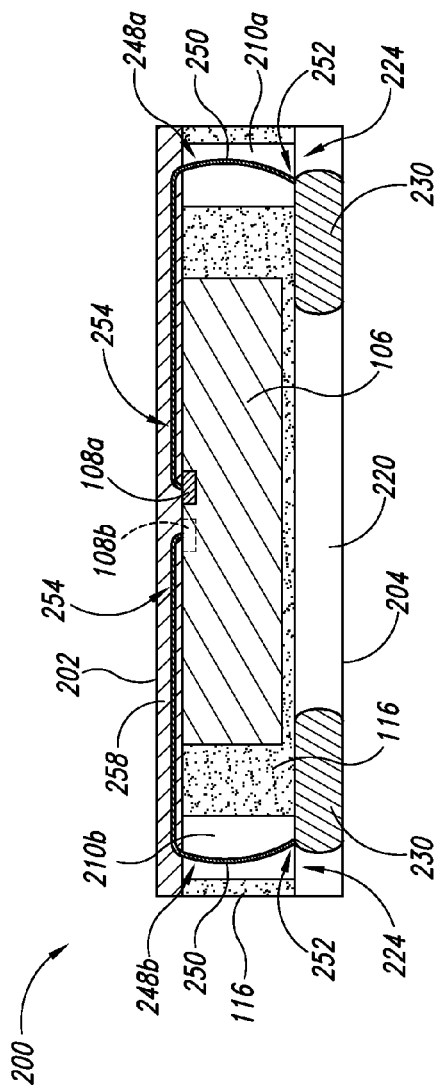
FIG. 2A is a side cross-sectional view of a semiconductor assembly configured in accordance with an embodiment of the invention.

FIG. 2A illustrates one embodiment of a semiconductor assembly 200 that is processed and singulated from the molded wafer 110. More specifically, FIG. 2A is a side cross-sectional view of a semiconductor assembly 200 including one of the dies 106 embedded in the mold material 116. The assembly 200 includes interconnect structures or electrical connectors 248 (identified individually as a first electrical connector 248a and a second electrical connector 248b) that extend from a first side 202 of the assembly 200 to a second side 204. In this embodiment, the electrical connectors 248 can have wire bonds 250 that extend through depressions or openings 224 in the mold material 116.

Figure 2B:
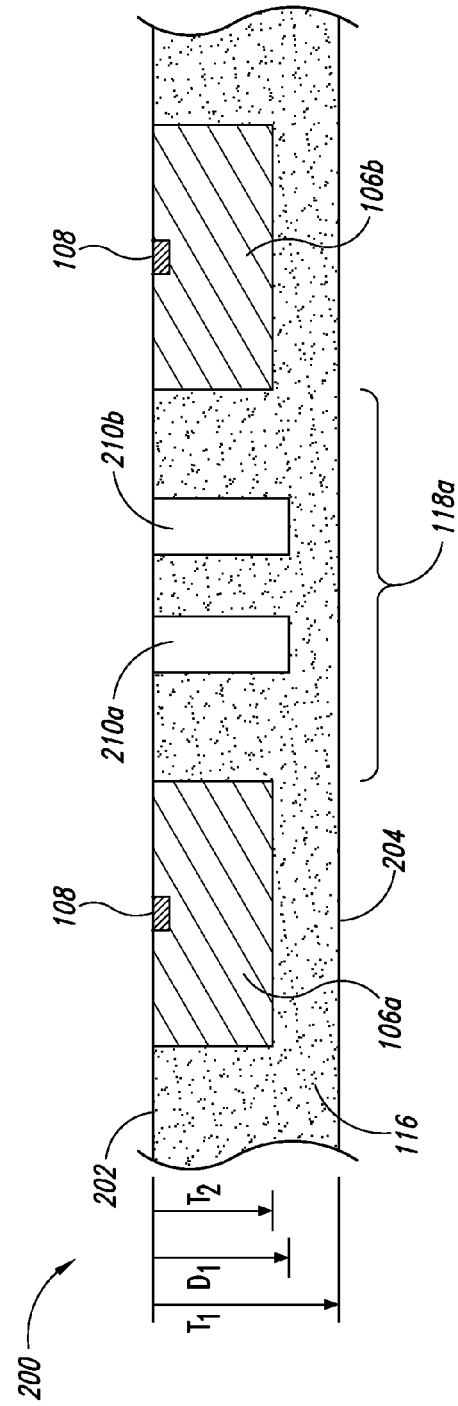
FIGS. 2B and 2C are side cross-sectional views illustrating various stages in a method of manufacturing a semiconductor assembly configured in accordance with an embodiment of the invention.

Individual wire bonds 250 can be composed of a conductive material, such as nickel, copper, gold, silver, platinum, alloys of these metals, and/or any other conductive material suitable for wire bonding or similar techniques. The characteristics of the wire bonds 250 can be selected based on device-specific processor or performance needs. For example, the wire bonds 250 can have a diameter, geometry (e.g., round cross-section or flat cross-section), and/or modulus of elasticity selected to satisfy performance and integration requirements. The wire bonds 250 connect individual corresponding bond-sites 108 (identified individually as a bond-site 108a and a second bond-site 108b shown in broken lines) at the first side 202 to corresponding contacts 230 at the second side 204. The second bond-site 108b illustrated in FIG. 2A is out of the plane of FIG. 2A but shown in broken lines for the purposes of illustration. As illustrated in FIGS. 2D and 2J, in certain embodiments, the bond-sites 108 can be staggered or aligned with each other.

The contacts 230 can include a conductive material 232 (e.g., solder) that is disposed in the openings 224 proximate to the second side 204. In certain embodiments, the contacts 230 can be generally coplanar with the second side 204 as shown in FIG. 2A. In other embodiments, however, the contacts 230 can be recessed from or project from the second side 204 and form bumps to facilitate stacking of the assembly. The contacts 230 can be disposed at an intersection between trenches 210 formed in the first side 202 and channels 220 (only one of which is shown in FIG. 2A) formed in the second side 204. In the embodiment illustrated in FIG. 2A, the trenches 210 run generally perpendicular to the plane of FIG. 2A and the channel 220 runs generally parallel to the plane of FIG. 2A. A first portion 252 of the wire bond 250 is attached or embedded in the contact 230, and a second portion 254 of the wire bond 250 is attached to the corresponding bond-site 108. The assembly 200 further includes a dielectric encapsulant 258 disposed over the first side 202 of the assembly 200 which at least partially covers the wire bonds 250 and bond-sites 108. The dielectric material 258 can electrically isolate the connectors 248 and support the wire bonds 250.

As explained in detail below, the assembly 200 incorporates the processing benefits from WLP and the reconfigured molded wafer 110, while still providing high quality interconnects that can be formed with relatively simplified processing steps. For example, rather than ablating, etching or drilling individual vias, the openings 224 through the mold material 116 are formed at intersections of the first side trenches 210 and corresponding second side channels 220. In addition, in the embodiment shown in FIG. 2A, the electrical connectors 248 include continuous wire bonds 250 that provide a uniform electrical connection through the assembly 200 without requiring the complex process of forming, plating and filling the vias associated with conventional interconnects.

The assembly 200 and electrical connectors 248 have been completely formed in the embodiment illustrated in FIG. 2A. FIGS. 2B-2J described below illustrate various techniques and stages in a method of forming the assembly 200 of FIG.

2A. FIG. 2B is a cross-sectional view of the assembly 200 along the line A-A of FIG. 1B that illustrates a stage of processing the mold material 116 around the first and second dies 106a-b. At this stage, a portion of the mold material 116 is removed to form one or more trenches 210 (identified individually as a first trench 210a and second trench 210b) in the row 118a between the first and second dies 106a-b. The trenches 210 are formed at the first side 202 and extend to an intermediate depth in the mold material. More specifically, the mold material 116 has a first thickness $T_1$, and the first and second dies 106a-b each have a second thickness $T_2$ less than the first thickness $T_1$. The first and second trenches 210a-b each have a first depth $D_1$ in the mold material 116 less than the first thickness $T_1$ of the mold material 116 and equal to or greater than the second thickness $T_2$ of the dies 106. Accordingly, the individual trenches 210 can extend deeper into the mold material 116 than the individual dies 106 without extending all the way through to the second side 204 of the assembly 200.

In certain embodiments, forming the trenches 210 can include partially dicing the mold material 116 with a cutting device (not shown), such as a wafer saw, blade, laser, fluid jet, etchant, or other tool suitable for removing controlled portions of the mold material 116. For example, to form the first and second trenches 210a-b, two spaced apart cutting devices can remove the corresponding mold material 116 in a single pass in the row 118a. In other embodiments, a single cutting device can remove the mold material 116 by making multiple passes and repositioning the cutting device and/or the wafer between passes. In certain embodiments, a single trench 210 (rather than first and second trenches 210a-b) can be formed in the row 118a having a width generally the same as the width between the outer walls of the first and second trenches 210a-b (as shown in broken lines in FIG. 2B). In addition, although the trenches 210 illustrated in FIG. 2B have a generally rectilinear cross-section, one skilled in the art will appreciate that that the trenches 210 can include other configurations including, but not limited to, curved sidewalls or smooth transitions between the sidewalls of the trenches 210.

Figure 2C:
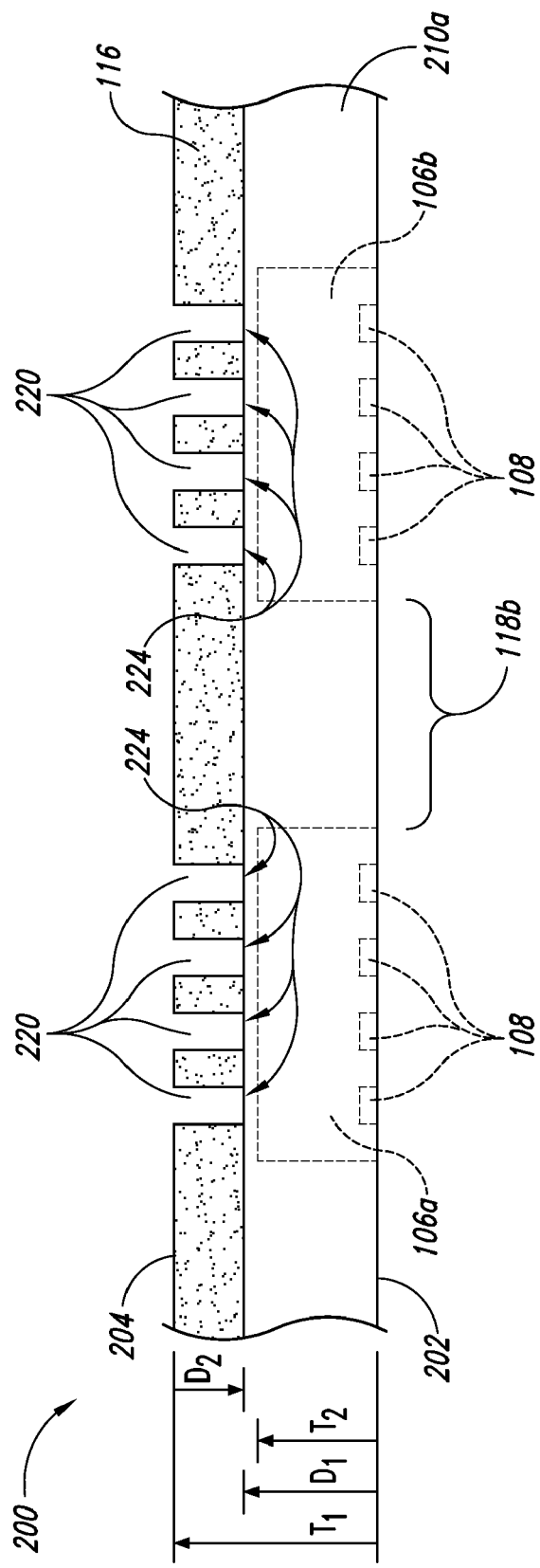
Figure 2D:
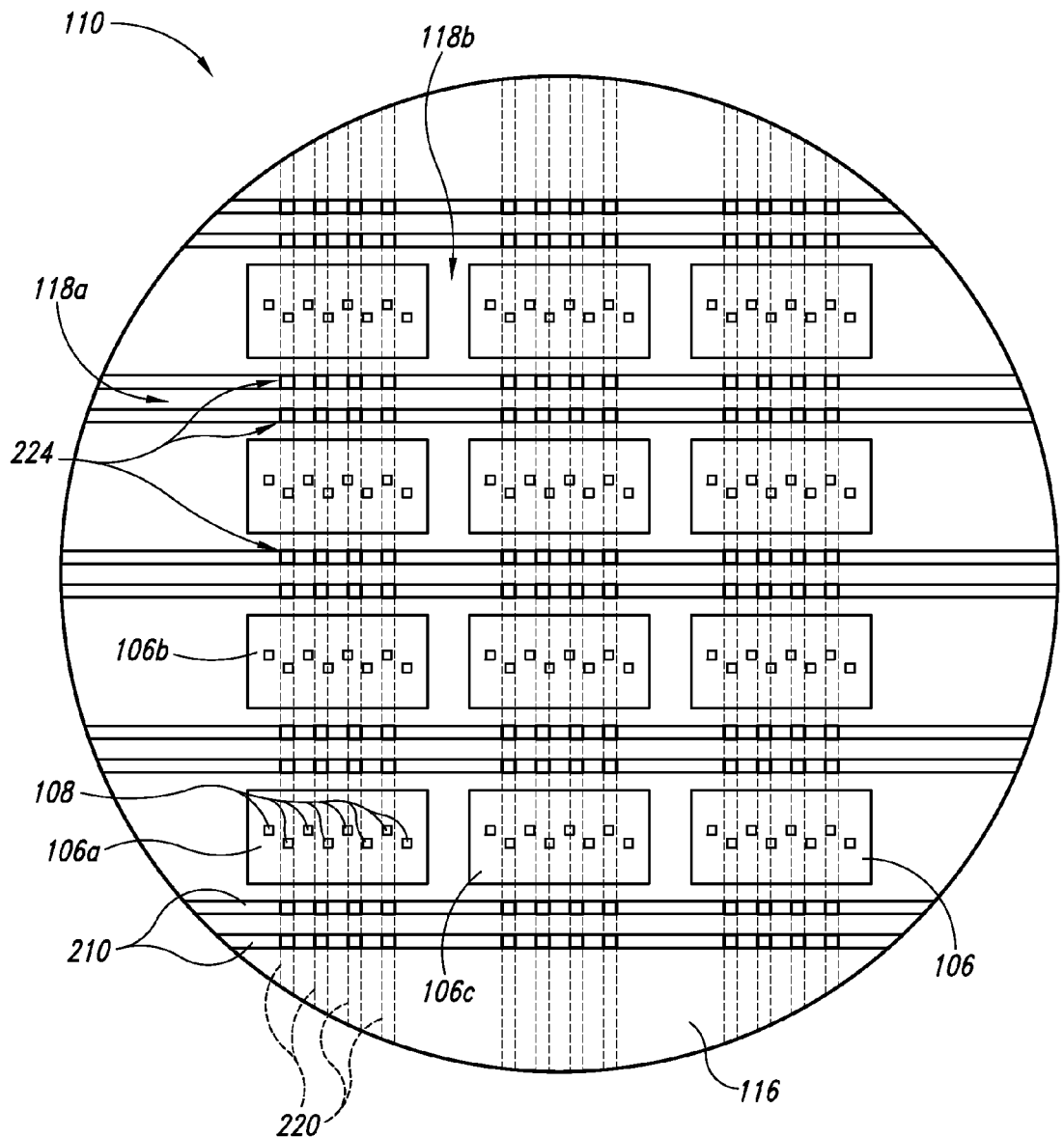
FIG. 2D is a top view illustrating a stage in a method of manufacturing a semiconductor assembly configured in accordance with an embodiment of the invention.

FIG. 2C illustrates a stage after forming the trenches 210 in the first side 202 in which the mold material 116 is selectively removed from the second side 204 to form openings 224 at intersections with the trenches 210. More specifically, FIG. 2C is a cross-sectional view of the assembly 200 along the line B-B of FIG. 1B. For the purposes of illustration, the assembly 200 shown in FIG. 2C is inverted so that the second side 204 is facing up. In addition, the dies 106 and the bondsites 108 are out of the plane of FIG. 2C and shown in broken lines for reference. In this configuration, multiple second side channels 220 are formed in a direction generally transverse to the trenches 210 described above (only the first trench 210a is shown in FIG. 2C). The channels 220 can be formed in a manner generally similar to that described above with reference to the trenches 210. In certain embodiments the channels 220 can be generally similar to the trenches 210 and are called channels rather than trenches for the purposes of clarity in distinguishing between the two.

In the embodiment illustrated in FIG. 2C, the channels 220 are not formed in the column 118b between the first and second dies 106a-b, but rather at a preselected pitch within the footprint of the individual dies 106. In other embodiments, the channels 220 can be formed at any preselected location at the second side 204. The channels 220 have a second depth $D_2$ into the mold material 116 from the second side 204 that does not intersect the dies 106. The combination of the first depth $D_1$ of the trenches 210 and the second depth $D_2$ of the channels 220, however, is equal to or greater than the first thickness $T_1$ of the mold material 116. Accordingly, the intersections between the first side trenches 210 and the second side channels 220 form the openings 224 and provide access through the mold material 116.

FIG. 2D is a top view of the molded wafer 110 that illustrates the configuration of the trenches 210 and intersecting channels 220 with reference to the individual dies 106. At this stage in the processing, the openings 224 have been formed in the rows 118a between dies 106. In the embodiment illustrated in FIG. 2D, the first side trenches 210 run parallel to and are spaced apart from one another in the rows 118a between the dies 106. The second side channels 220 (shown in broken lines) run generally perpendicular to the trenches 210 and within the footprints of individual dies 106. The intersections between the trenches 210 and channels 220 accordingly form the openings 224 in the rows 118a. In other embodiments, however, the channels 220 and trenches 210 can be configured to form the openings 224 around the periphery of the individual dies 106 and not only in the rows 118a between them.

The configuration and method of forming the openings described above provide a relatively fast and cost-effective method of forming the openings 224 through the mold material 116. For example, cutting a single second side channel 220 after forming the first side trenches 210 creates multiple openings 224 at the intersections with only a single pass through the mold material 116. In addition, removing the mold material 116 with the trenches 210 and channels 220 uses existing methods and avoids some of the challenges associated with conventional via techniques. For example, drilling with a laser can create non-uniform vias having an entry diameter that is larger than an exit diameter. Another challenge associated with drilling a via includes unwanted melted and resolidified mold material that can remain at the entry side of the via. Moreover, adequately plating and filling a via having a small aspect ratio formed by drilling techniques can also provide a significant challenge.

After forming the trenches 210 and the channels 220, FIGS. 2E and 2F illustrate a stage in which the contacts 230 are formed at the second side 204 of the assembly 200. More specifically, FIG. 2E is a side cross-sectional view of the assembly 200 along the line B-B of FIG. 1B, and FIG. 2F is a side cross-sectional view of the assembly 200 along the line A-A of FIG. 1B. Referring to FIGS. 2E and 2F together, the contacts 230 are formed by disposing the conductive material 232 in the channels 220 aligned with corresponding openings 224.

For the purposes of illustration, FIG. 2E illustrates different methods of disposing the conductive material 232 in the same assembly 200. In certain embodiments, for example, the conductive material 232 can be deposited or embedded in the openings 224 by printing, disposing with a conductive inkjet, sputtering or other methods. As shown towards the left of FIG. 2E, a printing assembly 236 deposits the conductive material 232 in the channels 220. The printing assembly 236 can include a squeegee blade 238 and a stencil 240 having holes 242 aligned with the channels 220 and corresponding openings 224. As the squeegee blade 238 passes over the stencil 240, discrete amounts of the conductive material 232 are disposed though corresponding holes 242 in the stencil 240 to form the contacts 230. In other embodiments and as shown toward the right side of FIG. 2E, a conductive inkjet 234 can embed discrete amounts of the conductive material 232 in the openings 224 to form the contacts 230.

As illustrated in FIG. 2F, the conductive material 232 does not fill the entire channel 220 (one of which is shown in FIG. 2F) and the contacts 230 are generally aligned with corresponding openings 224. As such, the contacts 230 are accessible for further processing through the trenches 210 from the first side 202. The conductive material 232 forming the contacts 230 can include a solder paste or other conductive material that can be configured to generally remain in the discrete locations at the openings 224. For example, to prevent the conductive material 232 from running or smearing into the trenches 210 or channels 220, the metallurgy of the conductive material 232 can be modified. Moreover, under bump metallization (not shown) can be applied to the sidewalls of the mold material 116 in the channels 220 to ensure that the conductive material 232 adheres with the mold material 116 and other metallization associated with the assembly 200.

In the embodiments illustrated in FIGS. 2E and 2F, the contacts 230 are generally coplanar with the second side 204, and can accordingly provide external electrical access to the assembly 200. For example, in certain embodiments, conductive members such as solder balls (not shown), can be attached to the contacts 230. In other embodiments, however, the contacts 230 can be recessed into or protrude from the second side 204. For example, the contacts 232 can be bumps or raised contacts that protrude from the second side 204 to facilitate stacking of the assembly 200 with other devices or assemblies.

After forming the contacts 230 proximate to the second side 204, processing of the electrical connectors 248 continues as illustrated in FIGS. 2G and 2H. FIGS. 2G and 2H, more specifically, are side cross-sectional views of the assembly 200 along the line A-A of FIG. 1B, illustrating the process of connecting wire bonds 250 between the first side 202 and the second side 204. Referring to the second die 106b shown toward the right side of FIG. 2G, the wire bond 250 is attached to the contact 230 and extends through the opening 224 and second trench 210b to connect to the bond-site 108. As shown towards the left side of FIG. 2G, a wire bonding tool 256 is in the process of making this connection. For example, a necked portion 258 of the tool 256 can be inserted in the first trench 210a and through the opening 224 to attach the wire bond 250 directly to the contact 230. In certain embodiments, the tool 256 can embed a first portion 252 of the wire bond 250 in the contact 230. For example, the tool 256 can pierce the conductive material 232 with the first portion 252 of the wire bond 250. In other embodiments, however, the bonding tool 256 itself can pierce the conductive material 232 and then inject the first portion 252 of the wire bond 250 into the contact 230. The tool 256 then spools the wire bond 250 and attaches a second portion 254 of the wire bond 250 to the bond-site 108 of the die 106a.

In certain embodiments, after attaching the wire bonds 250 between corresponding contacts 230 and bond-sites 108, the contacts 230 can be reflowed, as illustrated in FIG. 2H. Reflowing the contacts 230 can help ensure an adequate attachment of the contact 230 and the inserted or embedded first portion 252 of the wire bond 250. After forming the electrical connectors 248, the dielectric encapsulant 258 can be disposed at the first side 202 as illustrated in FIG. 2H. The encapsulant 258 can protect the dies 106 from contamination (e.g., due to moisture, particles, etc.). The encapsulant 258 can also stabilize and electrically isolate the wire bonds 250 and other conductive features at the first side 202. In certain embodiments, the encapsulant can be composed of a dielectric material and disposed on the assembly 200 in a molding process.

Figure 2I:
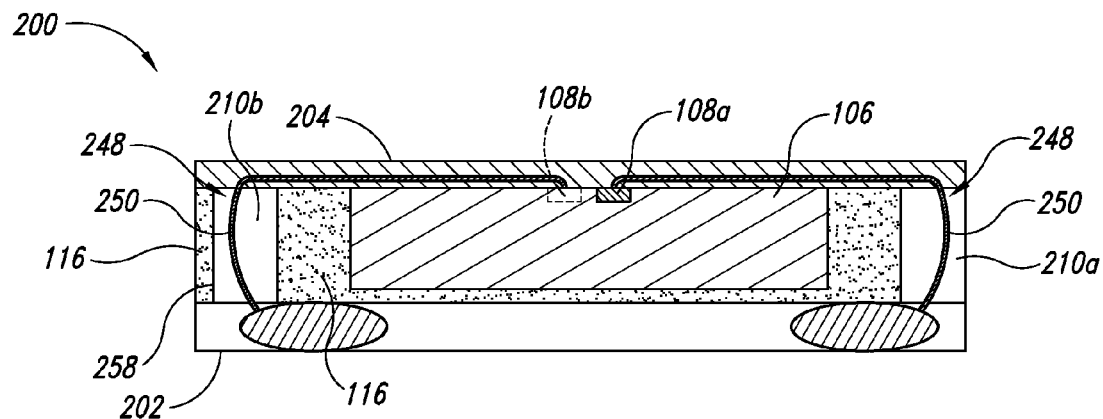
Figure 2J:
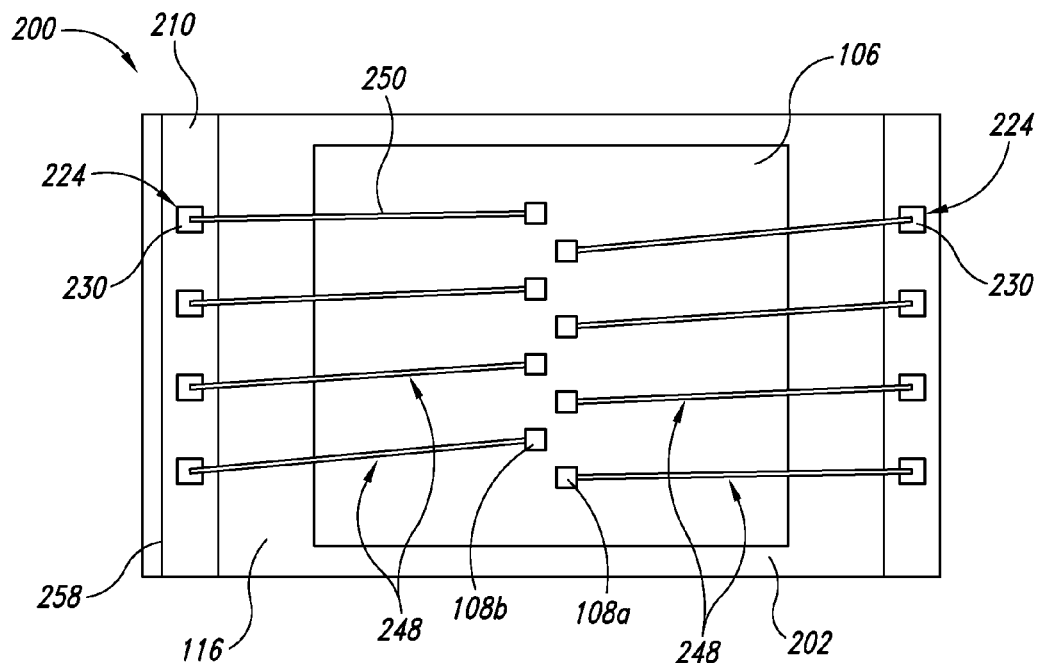
FIG. 2J is a top view illustrating a stage in a method of manufacturing a semiconductor assembly configured in accordance with an embodiment of the invention.

Turning next to FIGS. 2I and 2J, individual assemblies 200 with corresponding dies 106 and components are singulated from the molded wafer 110. More specifically, FIG. 2I is a side cross-sectional view of the singulated assembly 200 along the line A-A of FIG. 1B, and FIG. 2J it a top view of the singulated assembly 200. For the purposes of illustration, however, FIG. 2J does not show the encapsulant 258 at the first side 202 to better illustrate the individual electrical connectors 248. Referring to FIGS. 2I and 2J together, the assembly 200 can be singulated such that the electrical connectors 248 are either enclosed or exposed at a periphery of the assembly 200. The assembly 200 can be singulated, for example, by cutting the molded wafer 110 of FIG. 1B along the rows 118a and columns 118b between the individual dies 106. In certain embodiments, the rows 118a are generally bisected between corresponding trenches 210. In other embodiments, however, individual dies 106 can be singulated along the rows 118a (or columns 118b) to leave a predetermined amount of molding material 116 around the periphery of the individual dies 106 and electrical connectors 248. As shown towards the left side of FIGS. 2I and 2J, for example, the singulated assemblies 200 include a side-wall portion 258 that encloses the wire bond 250 within the mold material 116 between the first and second sides 202, 204. In other embodiments, however, the assemblies 200 can be singulated such that the connectors are not enclosed by the mold material 116 and exposed at the periphery of the assembly 200. As shown for the purposes of illustration on the same assembly 200 towards the right side of FIGS. 2I and 2J, the electrical connector 248 is exposed after the molding material 116 is removed during the singulation process. Exposing the electrical connector 248 at the sides of the assembly 200 provides the benefit of another location to electrically connect to in a later stage of the processing.

FIG. 3A is a cross-sectional side view of an assembly 300 configured in accordance with another embodiment. The assembly 300 is generally similar to the assembly 200 described above with reference to FIGS. 1A-2J; however in this embodiment the assembly 300 has electrical connectors 348 (individually identified as a first electrical connector 348a and a second electrical connector 348b) including wire bonds 350 with corresponding deformed first portions 352 that form contacts 330 at the second side 204. Rather than forming the contacts 230 described above by depositing the conductive material 232 in the openings 224, the contacts 330 illustrated in FIG. 3A are formed with the first portion 352 of the wire bonds 350. Accordingly, the electrical connectors 348 include a continuous and uninterrupted wire bond 350 connecting the first side 202 to the second side 204.

For the purposes of illustration, the first electrical connector 348a is shown towards the right side of FIG. 3A, and the second electrical connector 348b is shown towards the left side of FIG. 3A on the same assembly 300. The first electrical connector 348a includes a wire bond 350 extending through the assembly 300 and having a first portion 352 that is deformed generally into a hook-like member 358 having a generally curved or permanently deflected configuration. The wire bond 350 extends through the opening 224 at the intersection of the trench 210 and channel 220, and a second portion 354 of the wire bond 350 is attached to the corresponding bond-site 108a. The first portion 352 of the wire bond 350 is not required to form an actual hook, however the first portion 352 can be deformed and configured such that it will at least partially retain the wire bond 350 proximate to the second side 204. As such, the deformed first portion 352 of the wire bond 350 forms the contact 330 at the second side 204 and provides an external electrical access to the assembly 300.

The second electrical connector 348b illustrated towards the left side of FIG. 3A is generally similar to the first electrical connector 348a, except that the first portion 352 of the wire bond 350 is deformed to generally include a ball-like member 356. The ball-like member 356 is formed from the first portion 352 of the wire bond 350 and has a cross-sectional dimension that is at least as big as a cross-sectional dimension of the opening 224. Accordingly, the ball-like member 256 can be configured to at least partially retain the first portion 352 of the wire bond 350 proximate to the second side 204 to form the contact 330.

In the embodiments described above and illustrated in FIG. 3A, the contacts 330 can be substantially coplanar with or project from the second side 204. For example, the hook-like member 358 can be formed to be generally coplanar with the second side 204, and the ball-like member 356 can be formed to project from the second side 204. In other embodiments, however, the first portion 352 of the wire bond 350, including the hook like or ball-like members 358, 356, can be configured to form a contact 330 that is at least partially recessed into the second side 204 of the assembly 300.

As explained bellow and described in more detail with reference to FIGS. 3B and 3C, the electrical connectors 348 can provide high quality interconnects through and within the assembly 300 that can be produced in a cost effective manner. For example, the electrical connectors 348 can be formed with existing semiconductor processing and wire bonding techniques. In addition, the electrical connectors 348 include continuous and solid wire bonds 350, including the contacts 330 at the first portions 352, to form the electrical connectors 348 extending from the first side 202 to the second side 204.

FIG. 3B illustrates a processing stage at which the first portion 352 of the wire bond 350 is deflected or otherwise deformed into the hook-like member 358 at the first portion 352 of the wire bond 350. As described above with reference to FIGS. 1A-2J, the openings 224 are formed at the intersections between the first side trenches 210 and the second side channels 220. Accordingly, the wire bonding tool 256 can be positioned in the trench 210 proximate to the opening 224 and extend the first portion 352 of the wire bond 350 to protrude from the second side 204. A deflecting member 370 can permanently deflect the first portion 352 to form the contact 330 at the second side 204. For example, the deflecting member 370 can move at the second side 204 in a direction indicated by an arrow 372 to bend the first portion 352 of the wire bond 350. In other embodiments, the deflecting member 370 can move in other directions to form the hook-like member 358 of the first portion 352. After deforming the first portion 352, the second portion 354 of the wire bond 350 is attached to a corresponding bond-site 108 at the first side 202.

Figure 3C:
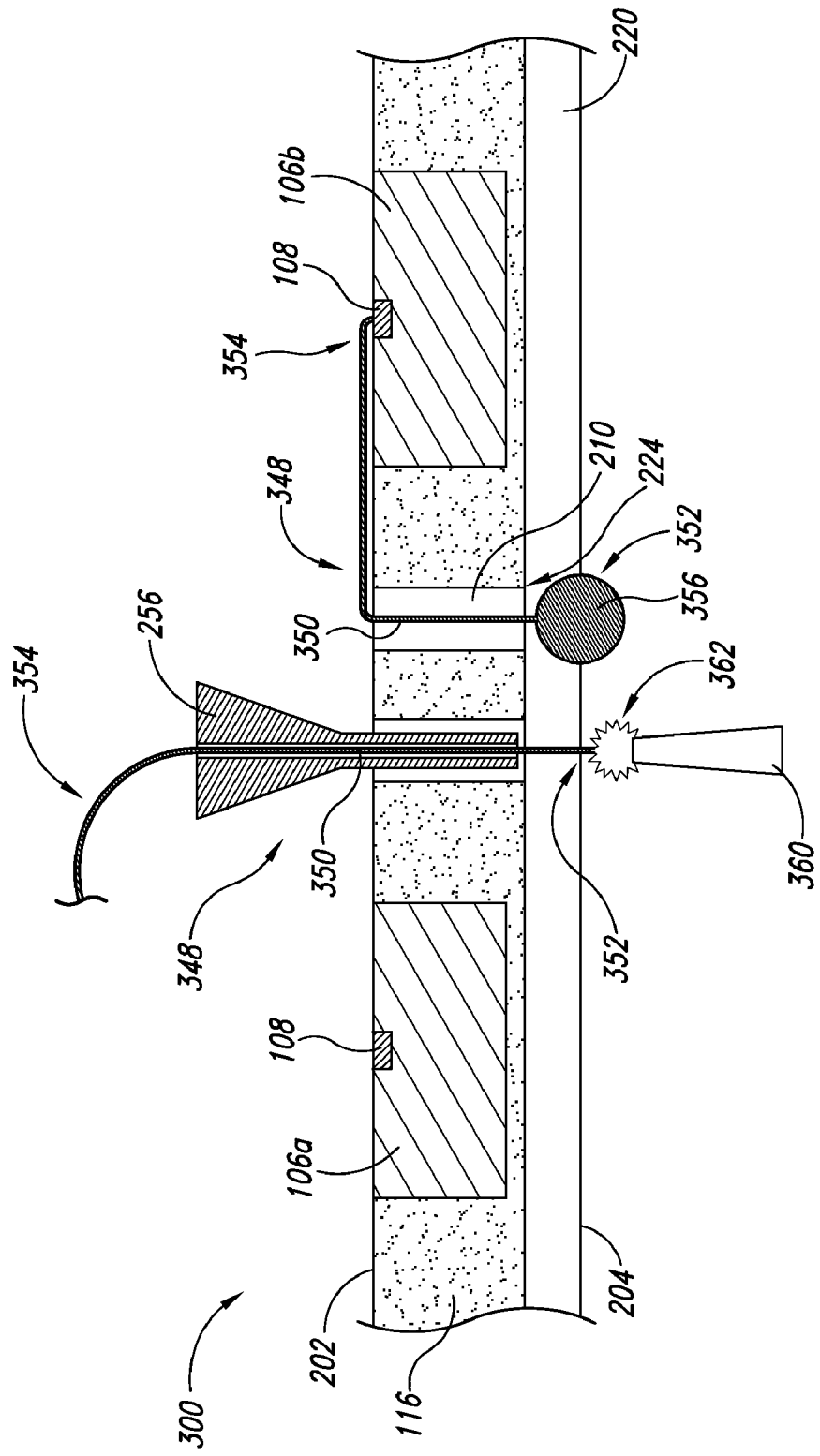

FIG. 3C illustrates a processing stage of the electrical connector 348 in which the ball-like member 356 is formed at the first portion 352 of the wire bond 350. In this embodiment, an electronic flame off ("EFO") tool 360 is positioned proximate to the first portion 352 of the wire bond 350 protruding from the second side 204. The EFO tool 362 emits a spark 362 or other heat source proximate to the first portion 352 and forms a free air ball, or ball-like member 356 at the first portion 352. Subsequently, the wire bonding tool 256 attaches the second portion 354 of the wire bond 350 to a corresponding bond-site 108 at the first side 202. Accordingly the ball-like member 356 forms the contact 330 at the second side 204.

Processing of the assemblies 300 can continue in a manner similar to the techniques and embodiments described above with reference to FIGS. 1A-2J. For example, the encapsulant 258 can be disposed at the first side 202 of the assembly 300, and individual assemblies can be singulated from the molded wafer 110 (shown in FIG. 1B) using the techniques described above.

Figure 4A:
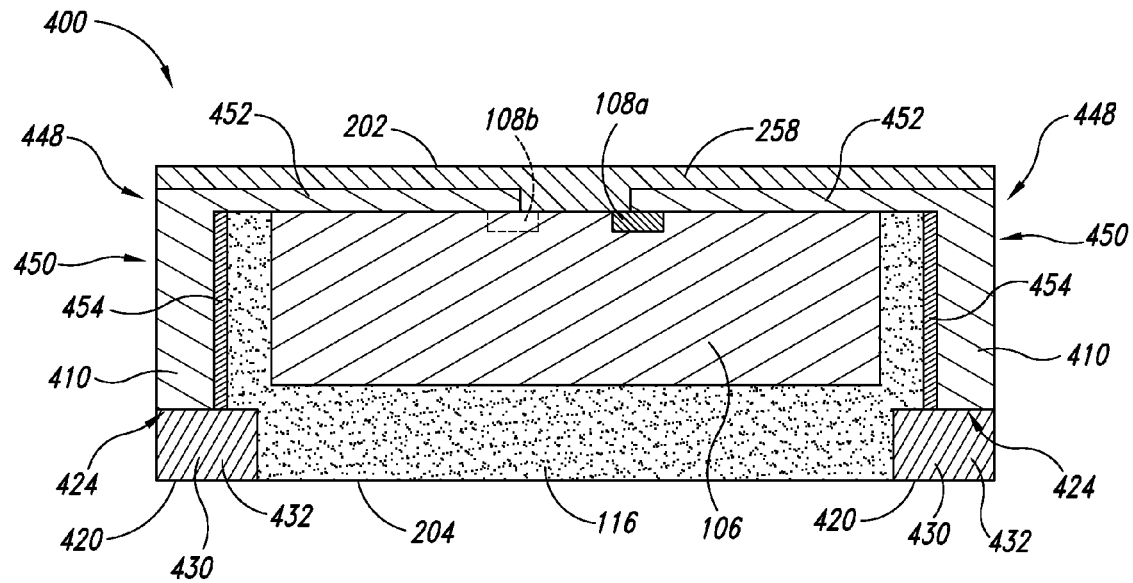
FIG. 4A is a side cross-sectional view of a semiconductor assembly configured in accordance with another embodiment of the invention.

FIG. 4A is a cross-sectional view of an assembly 400 configured in accordance with another embodiment. Certain aspects of the assembly 400 shown in FIG. 4A are generally similar to the assemblies described above; however in this embodiment the assembly 400 has electrical connectors 448 including redistribution structures 450, rather than wire bonds 250, that electrically connect the first side 202 to the second side 204. More specifically, each redistribution structure 450 can include a conductive layer 452 that is electrically connected to a second side contact 430 through a first side trench 410. In certain embodiments, sidewall portions of the first side trenches 410 can include a conductive plating 454 to facilitate an electrical connection between the conductive layer 452 and the contact 430. In other embodiments, however, the conductive layer 452 can at least partially fill a portion of each trench 410 aligned with the contact 430 to directly connect to the contact 430. Similar to the embodiments described above, the assembly 400 can also include the encapsulant 258 disposed over the redistribution structure 450 proximate to the first side 202.

Figure 4B:
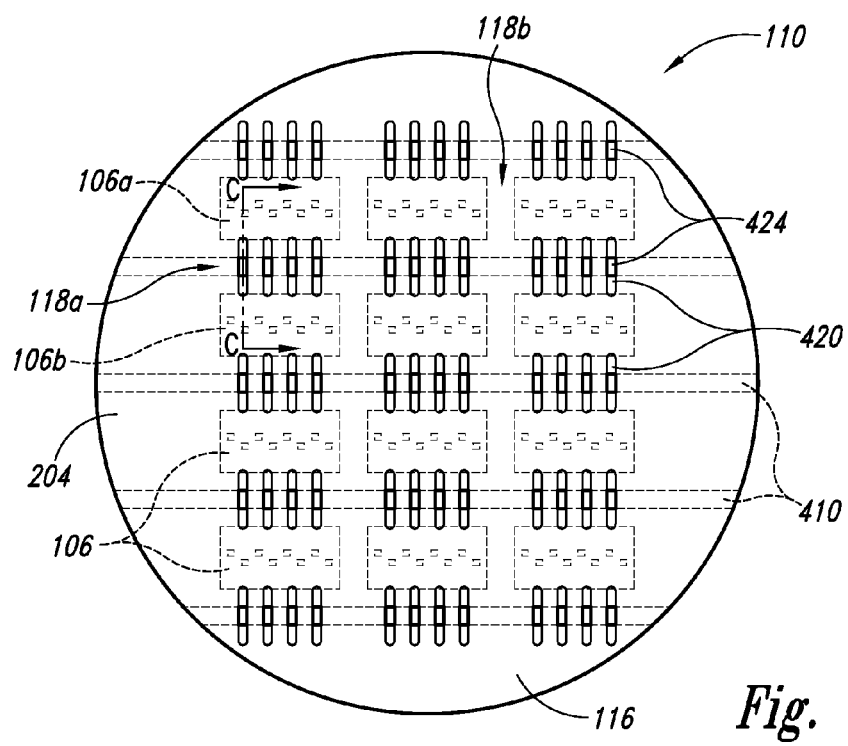
FIG. 4B is a top view illustrating a stage in a method of manufacturing a semiconductor assembly configured in accordance with an embodiment of the invention.
Figure 4C:
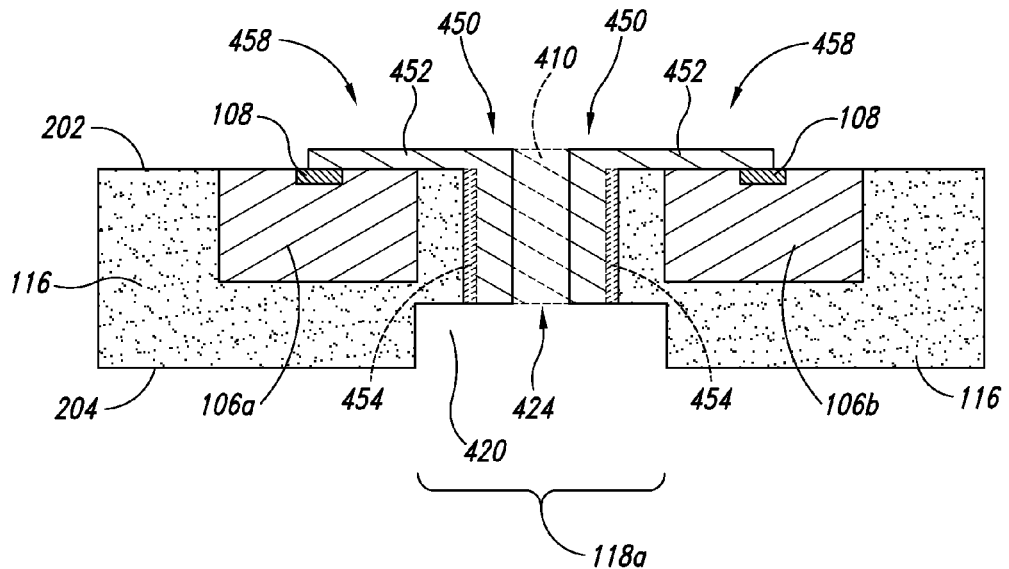
FIG. 4C is a side cross-sectional view illustrating a stage in a method of manufacturing a semiconductor assembly configured in accordance with an embodiment of the invention.
Figure 4D:
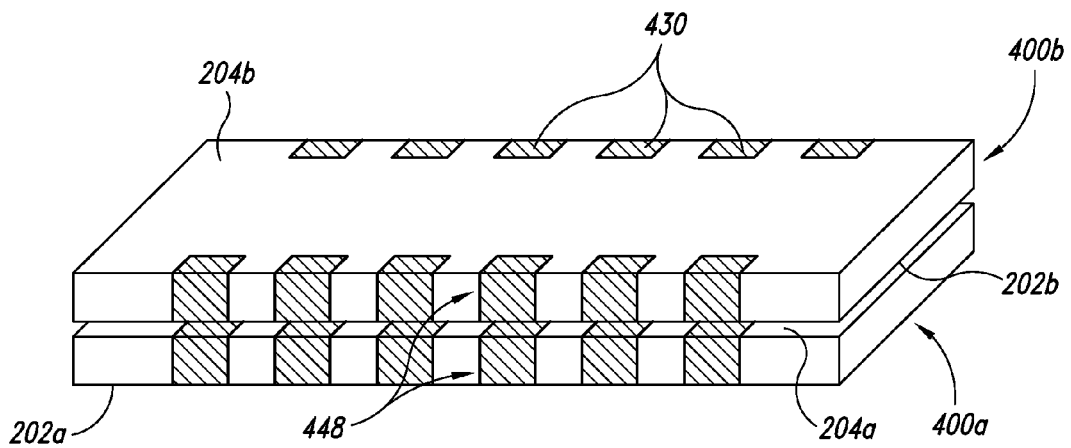
FIG. 4D is an isometric view of a stacked semiconductor assembly configured in accordance with an embodiment of the invention.

The processing steps associated with the assembly 400 illustrated in FIG. 4A can be generally similar to the processing steps described above; however in this embodiment forming openings 424 through the mold material 116 can differ. For example, as described below with reference to FIGS. 4B-4D illustrating representative processing stages, single trenches 410, rather than first and second parallel trenches 210a-b, can be formed in the first side 202 between individual dies 106. In addition, individual holes 420, rather than the second side channels 220, are formed in the second side 204 to intersect the trenches 410 and form the openings 424.

FIG. 4B, more specifically, is a bottom view of the molded wafer 110 that illustrates the configuration of the trenches 410 (shown in broken lines) and intersecting holes 420 with reference to the individual dies 106 (shown in broken lines). At this stage in the processing, single trenches 410 are formed at the first side 202 in the rows 118a. After forming the trenches 410, the holes 420 are formed in the second side 204 to intersect the trenches 410 at a preselected pitch. In certain embodiments, the holes 420 are formed with a drill, laser, etchant, fluid jet or other suitable technique. The holes 420 can have an oblong shape that is oriented generally transverse to the trenches 410. Similar to the embodiments described above, the combined depths (not shown) of the trenches 410 and the holes 420 can be greater than or equal to the thickness of the mold material 116 to create the openings 424.

After forming the openings 424, FIG. 4C illustrates a stage at which the redistribution structure 450 is formed proximate to the first side 202. In certain embodiments, the conductive layer 452 is coupled directly to corresponding bond-sites 108 and the conductive plating 454 (shown in broken lines) at the sidewall portions of the trench 410. In other embodiments, however, the conductive layer 452 can at least partially fill a portion of the trench 410 aligned with the opening 424 (as shown in broken lines) to connect directly with the contacts 430 (not shown in FIG. 4C) at the second side 204. The dielectric encapsulant 258 (not shown in FIG. 4C) can be disposed at the first side 202 after the conductive layer 452 is deposited to protect the die 106 and electrically isolate components of the assembly, such as the conductive layer 452 of the redistribution structure 450.

After the redistribution structure 450 is disposed proximate to the first side 202, individual contacts 430 can be embedded at the second side 204 to complete the electrical connectors 448 through the assembly 400. To form the contacts 430, discrete portions of a conductive material 432 (shown in FIG. 4A) can be disposed in the individual holes 420 from the second side 204 and aligned with the openings 424. The conductive material 432 can include similar materials and be disposed in a manner generally similar to that described above with reference to FIG. 2E.

FIG. 4D is an isometric view of singulated assemblies 400 (identified individually as a first assembly 400a and a second assembly 400b) in a stacked configuration. In the illustrated embodiment, a first surface 202b of the second assembly 400b can be stacked on a second surface 204a of the first assembly 400a. The first and second assemblies 400a-b can be singulated using the methods described above. In certain embodiments, singulating the dies 106 from the molded wafer 110 (see, e.g., FIG. 4B) can include generally bisecting the trenches 410 and the holes 420 along the rows 118a. Accordingly, after singulating the assemblies 400, the electrical connectors 448 can be exposed at side portions of the assemblies 400 to electrically connect to other components, devices and assemblies.

In certain embodiments, the processing steps described above with reference to FIGS. 4B-4D can be performed in a different order. For example, the holes 420 can be formed in the second side 204 before the trenches 410 are formed in the first side 202. Accordingly, the holes 420 can be drilled from the second side 204 to an intermediate depth and subsequently filled with the conductive material 432 to form the contacts 430. After filling the holes 420, the trenches 410 can be formed in the first side 202 to intersect the embedded contacts 430. The redistribution structure 450 can then be disposed at the first side 202 and complete the electrical connectors 448 between the first side 202 and the second side 204.

The electrical connectors 448 illustrated in FIGS. 4A-4D also incorporate the WLP benefits and utilize the spacing around the dies 106 to provide reliable and high quality interconnects with relatively simplified processing steps. For example, rather than drilling or etching through the entire assembly, the openings 424 are formed at the intersections of the trenches 410 and the holes 420. In addition, intersecting the trench 410 with the hole 420 (or vice versa) reduces the depth and aspect ratio of these individual features, which can reduce the complexity of later processing steps. Accordingly, the illustrated embodiments can improve the manufacturability and reliability of the electrical connectors 448 using a simplified process.

Figure 5:
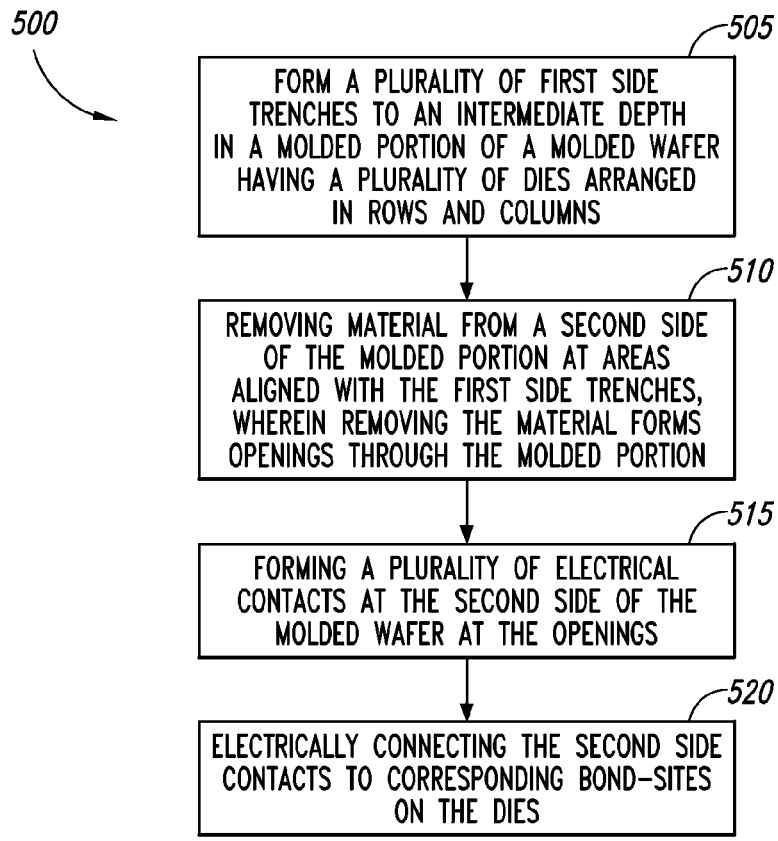
FIG. 5 is a flow diagram of a process of manufacturing a semiconductor assembly configured in accordance with still another embodiment of the invention.

FIG. 5 is a flow diagram of an embodiment of a method or process 500 for forming a semiconductor assembly. In this embodiment, the process 500 includes forming a plurality of first side trenches to an intermediate depth in a molded portion of a molded wafer having a plurality of dies arranged in rows and columns (block 505). In certain embodiments, this step can include forming a single trench in each row or column between the dies. In other embodiments, however, this step can include forming two or more parallel and spaced apart trenches in each row or column between the dies.

The process further includes removing material from a second side of the molded portion at areas aligned with the first side trenches (block 510). Removing the material from the second side forms openings through the molded portions of the molded wafer. In certain embodiments, this step can include forming second side trenches or channels to an intermediate depth. The second side channels can be generally transverse to the first side trenches. In other embodiments, however, this step can include forming holes from the second side to an intermediate depth in the mold material at individual locations aligned with the first side trenches. The combination of the depths of the first side trenches and second side channels (or second side holes) is greater than the thickness of the mold material of the molded wafer to form the openings through the mold material.

The process further includes forming a plurality of electrical contacts at the second side of the molded portion at the openings (block 515). In certain embodiments, this step can include disposing discrete amounts of a conductive material (e.g., solder) in the openings from the second side. In other embodiments, however, this step can include inserting a portion of a wire bond through the opening and deforming the portion of a wire bond at the second side. The process further includes electrically connecting the second side contacts to corresponding bond-sites on the dies (block 520). In certain embodiments, this step can include attaching a wire bond to the contact at the second side and to a corresponding bond-site at the first side. In embodiments including the deformed portion of the wire bond at the second side, this step can include attaching a portion of the wire bond distal from the deformed portion to a corresponding bond-site at the first side. In still further embodiments, this step can include disposing a redistribution structure at the first side.

The process illustrated in FIG. 5 can be accomplished in a relatively short period of time because individual vias do not have to be formed, plated and filled to create the electrical connections between the first and second sides of the assembly. Rather, the intersecting trenches and channels can quickly create multiple openings through the mold material. For example, after forming the first side trenches, forming a single second side channel creates multiple openings at the intersections in a single pass.

Figure 6:
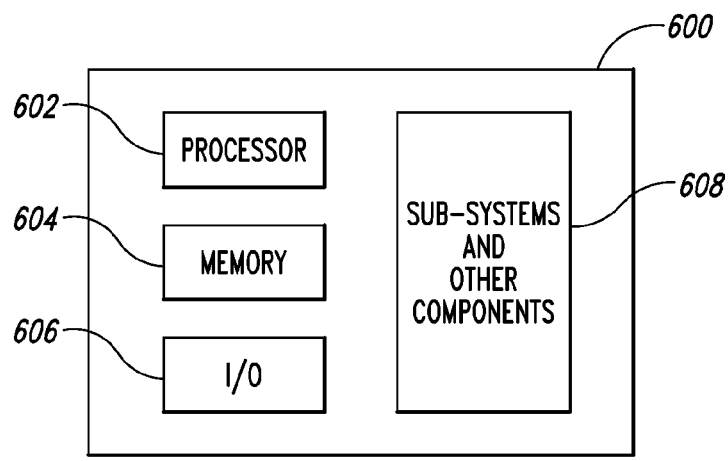
FIG. 6 is a schematic view of a system that incorporates semiconductor assemblies configured in accordance with further embodiments of the invention.

Any one of the assemblies having the electrical connectors described above with reference to FIGS. 1A-5 can be incorporated into any of a myriad of larger and/or more complex systems, a representative example of which is system 600 shown schematically in FIG. 6. The system 600 can include a processor 602, a memory 604 (e.g., SRAM, DRAM, flash and/or other memory devices), input/output devices 606 and/or other subsystems or components 608. The assemblies having electrical connectors described above with reference to FIGS. 1A-5 may be included in any of the components shown in FIG. 6. The resulting system 600 can perform any of a wide variety of computing, processing, storage, sensing, imaging and/or other functions. Accordingly, the representative systems 600 include, without limitation, computers and/or other data processors, for example, desktop computers, laptop computers, Internet appliances, hand-held devices (e.g., palm-top computers, wearable computers, cellular or mobile phones, personal digital assistants, music players, etc.), multi-processor systems, processor—based or programmable consumer electronics, network computers and mini-computers. Other representative systems 600 may be housed in a single unit or distributed over multiple interconnected units (e.g., through a communication network). The components of the system 600 can accordingly include local and/or remote memory storage devices, and any of a wide variety of computer readable media.

From the foregoing it will be appreciated that specific embodiments have been described herein for purposes of illustration, but that various modifications may be made without deviating from the invention. For example, one or more additional assemblies may be stacked on the assemblies in any of the embodiments described above to form stacked assemblies. Where the context permits, singular or plural terms may also include the plural or singular terms, respectively. Moreover, unless the word "or" is expressly limited to mean only a single term exclusive from the other items in reference to a list or two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature or additional types of features are not precluded.

Various modifications may be made without deviating from the embodiments disclosed herein. For example, features described in the context of particular embodiments may be combined or eliminated in other embodiments. Further, although advantages associated with certain embodiments have been described in the context of those embodiments, other embodiments may also exhibit such advantages, and not all embodiments need necessarily exhibit such advantages to fall within the scope of the invention. For example, trenches or channels of varying widths and depths can be formed in the mold material. Accordingly, the invention is not limited except as by the appended claims.

We claim:

1. An article of manufacture, comprising:
   a die having a first side, a second side, and an end between the first side and the second side;
   a mold material having a first side generally coplanar with the first side of the die, and a second side opposite the first side, wherein the mold material covers the die on the second side and at least substantially covering the end;
   a trench in the mold material at the first side of the mold material spaced apart from the end;
   a channel in the mold material at the second side, wherein the channel intersects with the trench to form a through-hole from the first side of the mold material to the second side of the mold material;
   a connector at the second side of the wafer; and
   an electrical connection electrically coupling the die to the connector, the electrical connection extending from the first side of the die and through the through-hole to the connector.

2. The article of manufacture of claim 1, further comprising:
   a bond site at the first side of the die;
   wherein the connector includes an electrical contact at the second side of the wafer; and
   wherein the electrical connection includes a wirebond connected to the bond site and the electrical contact.

3. The article of manufacture of claim 1 wherein the end comprises a first end and the trench comprises a first trench, the article of manufacture further comprising:
   a second end; and
   a second trench spaced apart from the first end.

4. The article of manufacture of claim 3 wherein the second end is opposite the first end.

5. The article of manufacture of claim 1 wherein the die is one of a plurality of dies embedded in the mold material, and wherein the mold material forms a semiconductor wafer.

6. The article of manufacture of claim 1, further comprising a dielectric material fabricated over the first side of the die.

7. The article of manufacture of claim 1, further comprising:
   a bond site on the die;
   wherein the connector includes a contact at the second side of the mold material; and
   wherein the electrical connection includes a wirebond connected to the bond site, passing through the trench and the channel, and connected to the contact.

8. The article of manufacture of claim 1, further comprising:
   a bond site on the die;
   wherein the connector includes an electrical contact in the mold material and exposed to the second side of the mold material; and
   a redistribution structure on the first side of the die, connected to the bond site, and connected to the electrical contact.

9. The article of manufacture of claim 8, further comprising a conductive plating between the mold material and the redistribution structure, wherein the conductive plating is electrically connected to the electrical contact.

10. A semiconductor wafer, comprising:
    a wafer of mold material having dies embedded therein with a face of the dies exposed, the face having a bond site;
    a trench in the wafer at a first side of the wafer adjacent to at least one die, wherein the trench is spaced apart from the die;
    a channel in the wafer at a second side of the wafer opposite the first side, wherein the channel intersects with the trench; and
    an electrical connection from the bond site through the trench and through the channel to a connector at the second side of the wafer.

11. The semiconductor wafer of claim 10 wherein the dies are made from a first material and the mold material is made from a second material different from the first material.

12. The semiconductor wafer of claim 10 wherein the electrical connection comprises a wirebond, the semiconductor wafer further comprising a dielectric material covering at least a portion of the face of the dies.

13. The semiconductor wafer of claim 10 wherein the electrical connection comprises a redistribution material.

14. The semiconductor wafer of claim 10 wherein the trench comprises a first trench, the semiconductor wafer further comprising a second trench in the wafer at the first side of the wafer and opposite the first trench.

15. The semiconductor wafer of claim 10 wherein the dies comprise a bond side at the exposed face of the dies, the semiconductor wafer further comprising an electrically conductive material in the channel and electrically connected to a bond site of the dies on the exposed face.

16. The semiconductor wafer of claim 10 wherein the electrical connection comprises a redistribution structure formed on the face of the dies.

17. A semiconductor wafer, comprising:
    a plurality of dies embedded in a wafer in a row, the wafer having a first side and a second side and a thickness;
    a trench at the first side with a portion of the wafer between the trench and the dies in the row, the trench having a depth;
    a channel at the second side intersecting with the trench, the channel having a depth, wherein a sum of the depth of the trench and the depth of the channel is greater than the thickness of the wafer such that an intersection between the trench and the channel defines a hole through the wafer;
    a plurality of connectors at the seconds side of the wafer; and
    a plurality of electrical connections, individual electrical connections extending from a bond site of one of the dies and extending through the channel and the trench to one of the connectors.

18. The semiconductor wafer of claim 17 wherein the semiconductor wafer comprises a plurality of rows and a plurality of corresponding trenches.

19. The semiconductor wafer of claim 17 wherein the trench comprises a first trench, the semiconductor wafer further comprising a second trench opposite the first trench, and wherein the channel intersects both the first trench and the second trench.

* * * * *

UNITED STATES PATENT AND TRADEMARK OFFICE
CERTIFICATE OF CORRECTION

PATENT NO. : 8,362,594 B2
APPLICATION NO. : 13/074938
DATED : January 29, 2013
INVENTOR(S) : Chua Swee Kwang et al.

Page 1 of 1

It is certified that error appears in the above-identified patent and that said Letters Patent is hereby corrected as shown below:

In the Claims:

In column 14, line 33, in Claim 15, delete "side" and insert -- site --, therefor.

In column 14, line 52, in Claim 17, delete "seconds" and insert -- second --, therefor.

Signed and Sealed this
Thirtieth Day of April, 2013

Teresa Stanek Rea
*Acting Director of the United States Patent and Trademark Office*